United States Patent [19]

Gerrish et al.

[11] Patent Number: 5,630,916
[45] Date of Patent: May 20, 1997

[54] MAGNETIC ORIENTING DEVICE FOR THIN FILM DEPOSITION AND METHOD OF USE

[75] Inventors: Kevin S. Gerrish, Spencerport, N.Y.; Paul H. Ballentine, Austin, Tex.; Dorian Heimanson, Rochester, N.Y.; Alan T. Stephens, II, Dayton, Ohio

[73] Assignee: CVC Products, Inc., Rochester, N.Y.

[21] Appl. No.: 369,381

[22] Filed: Jan. 6, 1995

Related U.S. Application Data

[63] Continuation-in-part of Ser. No. 25,261, Mar. 2, 1993, abandoned.

[51] Int. Cl.⁶ ................................................. C23C 14/34
[52] U.S. Cl. ........................... 204/192.2; 204/192.12; 204/298.16
[58] Field of Search ................ 204/192.12, 192.15, 204/192.2, 298.16, 298.17, 298.19, 298.2, 298.21, 298.22

[56] References Cited

U.S. PATENT DOCUMENTS

| | | | |
|---|---|---|---|
| 3,336,154 | 8/1967 | Oberg et al. | 204/192.2 |
| 4,094,764 | 6/1978 | Boucher et al. | 204/298.07 |
| 4,155,825 | 5/1979 | Fournier | 204/298.16 |
| 4,247,383 | 1/1981 | Greve et al. | 204/298.07 |
| 4,581,118 | 4/1986 | Class et al. | 204/192.2 |
| 4,595,482 | 6/1986 | Mintz | 204/298.19 |
| 4,673,482 | 6/1987 | Setoyama et al. | 204/192.2 |
| 4,810,346 | 3/1989 | Wolf et al. | 204/298.16 |
| 4,853,102 | 8/1989 | Tateishi et al. | 204/298.16 |
| 4,865,709 | 9/1989 | Nakagawa | 204/192.2 |
| 4,871,433 | 10/1989 | Wagner et al. | 204/192.12 |
| 5,006,219 | 4/1991 | Latz et al. | 204/298.16 |
| 5,026,470 | 6/1991 | Bonyhard et al. | 204/298.16 |
| 5,045,166 | 9/1991 | Bobbio | 204/192.32 |
| 5,061,838 | 10/1991 | Lane et al. | 204/298.11 |

FOREIGN PATENT DOCUMENTS

| | | | |
|---|---|---|---|
| 62-232911 | 10/1987 | Japan | 204/298.16 |
| 3056671 | 3/1991 | Japan | 204/298.08 |

OTHER PUBLICATIONS

Paper entitled "Manufacturing Techniques", pp. 1–28.
"Ferromagnetic Properties of Films" by Mitchell S. Cohen, M.I.T. Lincoln Laboratory, Lexington, Mass., Ch. 17, pp. 17–1 thru 17–43.
"Relation of thickness and some physical properties of NiFe thin films" by R.M. Valletta, G. Guthmiller, and G. Gorman, J. Vac. Sci. Technol. A9(4) Jul./Aug. 1991, American Vacuum Society, pp. 2093–2098.

*Primary Examiner*—R. Bruce Breneman
*Assistant Examiner*—Rodney G. McDonald
*Attorney, Agent, or Firm*—Eugene Stephens & Associates

[57] ABSTRACT

A sputtering apparatus for depositing a thin film (66) of magnetic material on a substrate (26) is modified to include a plate-shaped electromagnet (34, 44, or 70) for orienting magnetic domains within the film (66). The electromagnet (34, 44, or 70) has conductive windings (38; 46, 48, and 50; or 72) that are arranged for producing a magnetic field (42 or 52) within a plane (60) corresponding to a surface of the substrate (26). Field strength vectors (68) vary in absolute magnitude between points located along a first axis (62), but have substantially uniform components of magnitude at the same points measured in a common direction along the first axis (62).

11 Claims, 7 Drawing Sheets

MAGNETIC ORIENTING DEVICE FOR THIN FILM DEPOSITION AND METHOD OF USE

RELATED APPLICATIONS

This application is a Continuation-In-Part of parent application Ser. No. 08/025,261, filed 2 Mar. 1993, abandoned entitled MAGNETIC ORIENTING DEVICE FOR THIN FILM DEPOSITION. The parent application is hereby incorporated by reference.

FIELD OF INVENTION

The invention relates to sputtering apparatus for depositing thin films of magnetically orientable material on substrates and to vacuum processing apparatus for magnetically orienting the material on the substrates.

BACKGROUND

Conventional sputtering devices include a vacuum chamber enclosing a target electrode of selected material and a substrate onto which the material is to be deposited. Air within the chamber is evacuated to a low pressure and is partially replaced by an ionizable gas, such as argon. A power supply applies a negative potential to the target electrode. Gas ions strike the target, causing an emission of atoms from the target into a plasma from which the target material is deposited on the substrate.

In certain applications, such as the manufacture of magnetic recording heads, thin films of magnetic material need to be applied with a predetermined magnetic orientation. The thin films are deposited by sputtering apparatus in a predetermined orientation by exposing the substrate to a uniform magnetic field (i.e., equal magnitude field lines extending in a common direction). Ordinarily, permanent magnets placed in the vicinity of the substrate are used to generate the magnetic field.

For example, most commercial implementations locate a pair of permanent magnets on opposite sides of the substrate to generate the required field across the substrate. However, only a small portion of the magnetic field between the electromagnets exhibits the necessary uniformity, and this limits the area of the substrate over which the target material can be deposited with the required magnetic orientation.

U.S. Pat. No. 5,026,470 to Bonyhard et al. discloses an alternatively designed sputtering apparatus having a polygon-shaped electromagnet located beneath the substrate. A spiral coil having a plurality of sides forming a polygon is embedded in a pallet assembly for producing a plurality of uniform magnetic fields that extend perpendicular to each of the sides. A plurality of substrates is positioned on the pallet assembly with respective edges aligned with one of the sides. However, this apparatus is very large, difficult to manufacture, and inefficient to operate with smaller lot sizes.

After coating and subsequent processing, the substrates are cut into smaller units that are used for such purposes as heads for disk drives. An industry trend now requires larger substrates (e.g., 15.25 centimeters squared) to be coated with more accurately aligned magnetic domains (e.g., within one degree alignment). The increased accuracy provides improved yield from the substrate, and the increased area of the substrate permits more heads to be manufactured simultaneously.

The larger substrates are difficult to coat with the present designs of sputtering apparatus. For example, the permanent magnets located at either side of the substrate must be spaced at large distances to produce the required uniformity. However, the added spacing requires impractically large magnets be used to produce the required field strength. Similarly, interferences between magnetic fields on each side of the pallet assembly of Bonyhard et al. can significantly limit the size of substrates that can be coated with accurately aligned magnetic material.

Although a uniform magnetic field is required in the vicinity of the substrate for magnetically orienting particles of the target material as they are deposited on the substrate, the same magnetic field in the vicinity of the target can cause uneven erosion of the target and variations in the thickness of deposited target material across the surface of the substrate. The magnetic field reacts with an electric field in the vicinity of the target causing emitted electrons to drift across the target and to increase local ionization and accompanying bombardment of one end of the target.

The sputtering device of Bonyhard et al. provides for rotating the pallet assembly to provide a more uniform coating of the target material on the substrates. However, this adds to the size and complexity of the device and requires the use of uniformity shields which cut off part of the sputtered flux in order to produce a uniform film deposition.

SUMMARY OF INVENTION

The invention improves sputtering of thin magnetically oriented films by enabling large substrates to be coated with accurately aligned magnetic domains. A highly uniform magnetic field is produced in the vicinity of a substrate with a practically sized and powered electromagnet. The invention also provides for depositing magnetic material with a uniform thickness across substrate surfaces without adding significant size or complexity to the new apparatus and without using shields to cut off part of the deposited flux.

The improved sputtering apparatus includes the usual features of a vacuum chamber enclosing a target electrode and a substrate holder made from a nonmagnetic material. A substrate is mounted on the holder with a prepared surface facing away from the holder. The electromagnet is located just outside of the vacuum space adjacent to the holder and includes a plate-shaped core and a series of parallel windings that are distributed between two ends of the core.

The electromagnet produces a uniform magnetic field within a defined area of a plane located at a predetermined distance from the electromagnet corresponding to the location of the prepared surface of the substrate. The magnetic field is defined by a locus of field strength vectors that vary in absolute magnitude but have substantially uniform components of magnitude (e.g., within a tolerance of five percent) within the defined area of the plane. The uniform components of magnitude are also aligned in a uniform direction within the same area of the plane to produce a so-called "easy" axis of magnetization on the substrate surface that varies from uniformity by as little as plus or minus one degree.

This high degree of accuracy is obtained over a large area of the substrate surface (e.g., over 15 centimeters squared) by specially arranging the windings of the electromagnet on the plate-shaped core. For example, the windings can be divided into groups for carrying different amounts of current. More current is carried by the windings closest to the two ends of the core to compensate for changes in the strength of the magnetic field close to the ends. The current within each group of windings is adjusted to produce the uniform components of field strength in the uniform direction along the easy axis of magnetization across the entire surface of the substrate. In addition, the current can be adjusted to compensate for the buildup of magnetic material on the substrate or elsewhere in the vacuum chamber, which can increasingly shunt the desired magnetic field.

Similar results can be obtained by varying the density of the windings between the two ends of the core. For example, the windings can be arranged with increasing numbers of winding layers approaching the two ends of the core to appropriately vary the resulting magnetic field. Improved directional uniformity is obtained by specially shaping a core of the magnet to further compensate for variations in the magnetic field at both ends of the magnet.

However, we have also discovered that magnetically permeable field shapers can be positioned next to the substrate to greatly increase the area of the substrate surface that can be magnetically oriented with a given size electromagnet. The field shapers are made of a paramagnetic material that is specially shaped and oriented to align a much larger portion of the magnetic field to a uniform direction.

The invention also provides for minimizing the harmful effects of the magnetic field on the target to provide a more uniform coating thickness across the substrate. For example, the plate-shaped electromagnet can be powered by an alternating current that periodically reverses the direction of the magnetic field. The alternating current has a cycle rate less than 10 hertz to prevent the formation of significant eddy currents in the electromagnet core.

DRAWINGS

DETAILED DESCRIPTION

Figure 1:
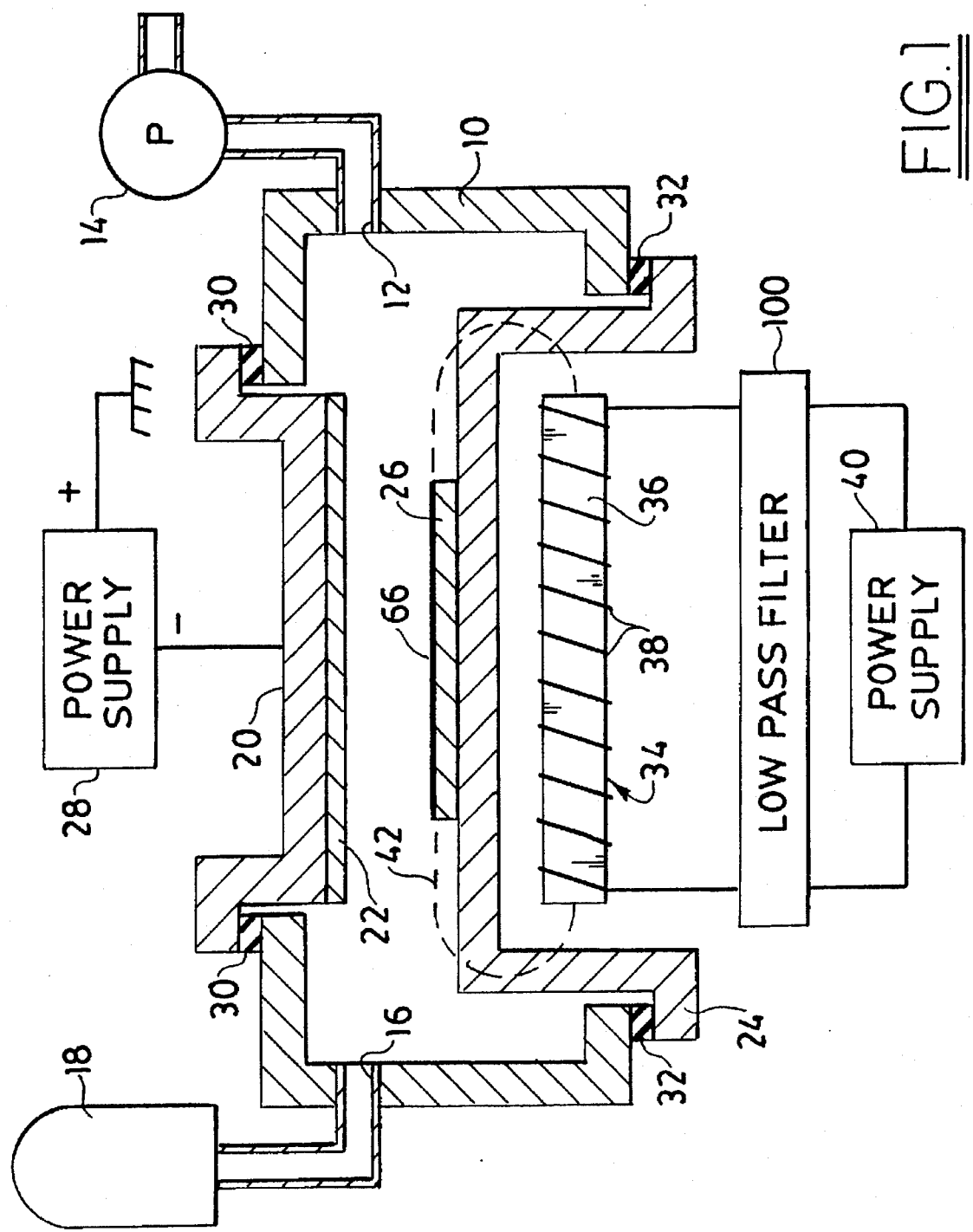
FIG. 1 is a schematic side view of a sputtering apparatus arranged in accordance with the invention for coating a substrate with magnetic material.

One example of the invention is shown in FIG. 1 as a modification of conventional sputtering apparatus. A vacuum chamber 10 has an outlet port 12 connected to a pump 14 for evacuating air from the vacuum chamber 10 and an inlet port 16 for admitting an ionizable gas, such as argon, from a pressurized source 18.

Projecting within the vacuum chamber 10 are an electrode 20 supporting magnetic target material 22, such as permalloy in concentrations of 81 percent nickel and 19 percent iron, and a holder 24 made of a nonmagnetic material for supporting a substrate 26. The target electrode 20 is connected to a high voltage radiofrequency (r.f.) power supply 28 for bringing the target electrode 20 to a negative potential. A bias voltage can also be applied to the substrate 26 by similar conventional means (not shown) for better controlling sputtering processes. Insulators 30 and 32 respectively isolate the target electrode 20 and the substrate holder 24 from the vacuum chamber 10.

In accordance with the invention, an electromagnet 34 is positioned as close as possible to the substrate 26 without being within the space evacuated by the vacuum chamber 10 to avoid outgassing effects from electromagnetic components and to make servicing easier. The electromagnet 34 has a plate-shaped core 36 made of a magnetic material, such as cold rolled steel, and conductive windings 38 that are wrapped around the core 36.

Overall, the electromagnet 34 has the geometric form of a rectangular parallelepiped. Each side of the electromagnet 34 is at least fifty percent larger than a corresponding side of the substrate 26. A power supply 40, connected to the conductive windings 38, is sized to produce a magnetic field 42 in the vicinity of the substrate 26 of about 30 to 100 gauss. Preferably, the magnetic field 42 is applied completely externally of the vacuum chamber 10 to minimize the number of components within the vacuum chamber 10.

Figure 2:
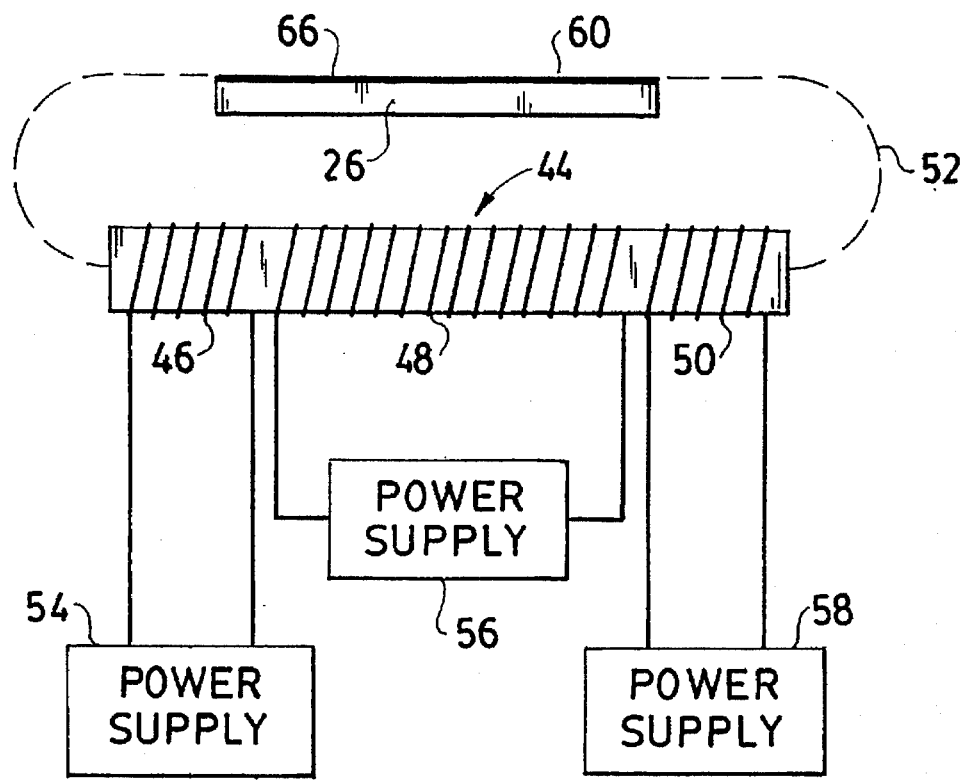
FIG. 2 is a side view of a plate-shaped electromagnet for use in the sputtering apparatus of FIG. 1 having three separately powered windings for varying the strength of the magnetic field across the substrate.

FIG. 2 shows an alternative plate-shaped electromagnet 44 having three separately powered windings 46, 48, and 50 for producing a combined magnetic field 52. Respective currents in the three windings 46, 48, and 50 are independently controlled by three power supplies 54, 56, and 58. The windings 46 and 50 along the ends of the electromagnet 44 carry more current than the winding 48 at the center of the electromagnet to compensate for changes in the magnetic field 52 approaching the ends of the electromagnet.

Figure 3:
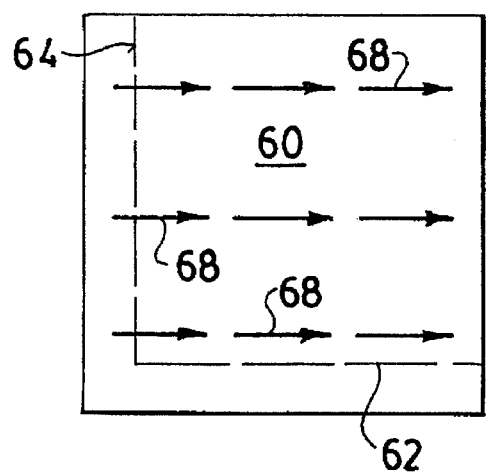
FIG. 3 is a plan view of a plane corresponding to a surface of the substrate within which the magnetic field is defined.

The magnetic field 52 is produced within a given area of a plane 60, corresponding to a surface of substrate 26, at a predetermined distance from the electromagnet 44. The plane 60, outlined in FIG. 3, has first and second orthogonal axes 62 and 64. The first orthogonal axis 62, which corresponds to the desired "easy" axis of magnetic film 66 deposited on the surface of substrate 26, extends perpendicular to a direction of the windings 46, 48, and 50; and the second orthogonal axis 64, which corresponds to the film's so-called "hard" axis, extends parallel to the same windings. The magnetic field 52 is defined by a locus of field strength vectors 68 that vary in absolute magnitude between points located along the first axis 62.

However, the respective currents in the windings 46 and 50 are adjusted with respect to the current in the winding 48 so that the field strength vectors 68 have substantially uniform components of magnitude (e.g., within a tolerance of five percent) measured in a common direction along the first axis 62. The field strength vectors 68 also have substantially zero components of magnitude measured in a common direction along the second axis 64. In other words, excluding components normal to the plane 60, the magnetic field 52 has a uniform magnitude and direction throughout the area of the plane 60 for producing an average alignment between domains of the deposited film 66 within one degree of perfect alignment with the easy axis—a condition referred to as "uniaxial anisotropy".

Figure 4:
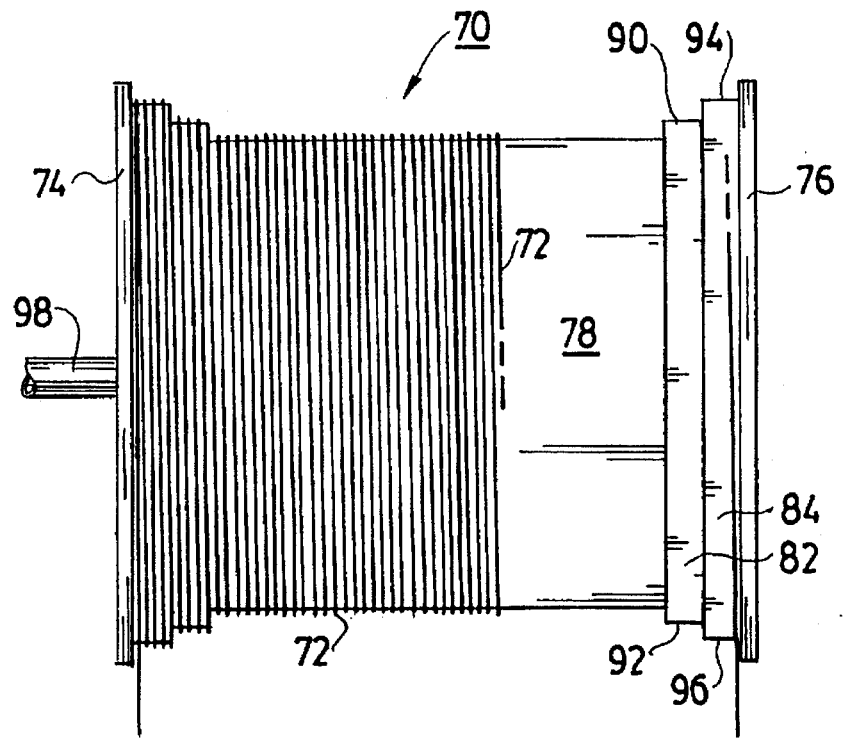
FIG. 4 is a plan view of an alternative plate-shaped magnet having a single-powered winding arranged on a stepped core in progressive layers.
Figure 5:
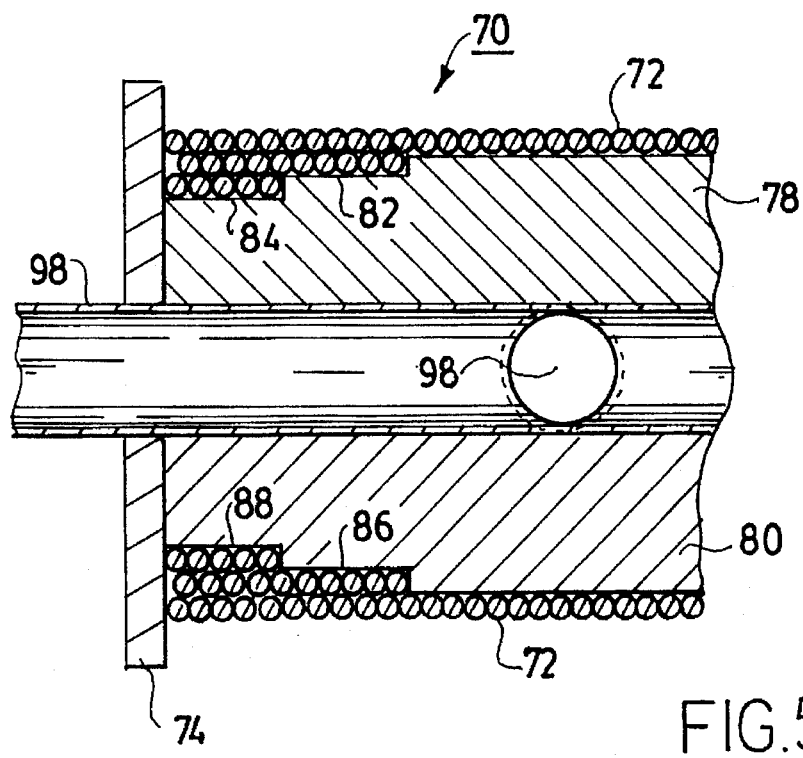
FIG. 5 is an enlarged broken-away side view of the electromagnet of the preceding figure showing a divided core and an increasing number of winding layers approaching one end.

FIGS. 4 and 5 show another alternative plate-shaped electromagnet 70 for producing a similar magnetic field within the plane 60. Although a single-powered winding 72 is used to produce the magnetic field, winding density is varied to compensate for changes in the magnetic field approaching ends 74 and 76 of the electromagnet 70.

A magnetic core is formed by inner and outer plates 78 and 80 having respective face steps 82, 84 and 86, 88 approaching the end 74 for accommodating multiple layers of windings without changing the external shape of the magnet. For example, face steps 82 and 86 are formed to a common depth that accommodates two layers of windings, and core steps 84 and 88 similarly accommodate three winding layers. A symmetrical arrangement of steps and winding layers approaches the other end 76.

The sides of the core plates 78 and 80 are also stepped to achieve more uniform directional accuracy within the plane 60. For example, first side steps 90 and 92 and second side steps 94 and 96 are formed on the opposite sides of inner and outer core plates 78 and 80 to compensate for variations in the magnetic field within the plane 60 adjacent to the corners of the electromagnet 70. A symmetrical arrangement of steps also approaches the end 74 of the electromagnet.

Although the sides are shown with just two discrete steps approaching each of the ends 74 and 76, more steps could also be used to better compensate for the continuous variations at the magnet's corners. In fact, it would be possible to shape the sides of the core plates 78 and 80 with smooth curves, but steps are still preferred for wrapping the winding 72 in fixed positions.

The inner and outer core plates 78 and 80 are made of a magnetic material, such as cold rolled steel, which shunts the effects of the windings crossing the outer core plate 80 on the magnetic field in the vicinity of the substrate 26. A space separating the two core plates 86 and 88 permits a network of nonmagnetic conduits 98 to be positioned within the electromagnet 70 for circulating coolant to remove heat generated by operation of the electromagnet. This arrangement obviates prior practices of machining similar passages in the core, which could distort the resulting magnetic field.

Referring again to FIG. 1, the magnetic field 42, which is required to orient magnetic domains of the film 66 deposited on the substrate 26, can also interact with an electrical field close to the target electrode 20 and bias an ion plasma toward one end of the target electrode 20. Electrons emitted from the target electrode 20 for exciting the ion plasma are shifted along the target electrode in a direction defined by the cross product of the interacting magnetic and electrical field vectors. The resulting uneven erosion of the target electrode 20 can cause variation in the thickness of the deposited film 66.

However, this problem is overcome by arranging the power supply 40 to produce alternating current power for energizing the electromagnet 34. A low pass filter 100 is connected in line with the alternating current power supply 40 to eliminate harmful effects of radiofrequency voltage fluctuations on the power supply.

The alternating current periodically reverses the direction of the magnetic field 42 but does not affect the desired alignment of the film domains along the easy axis of magnetization. Preferably, a cycle rate of less than one hertz is used in a square wave form to prevent uneven accumulations of film 66 on the substrate due to the directional interaction of the magnetic and electrical fields near the target electrode. However, cycle rates up to ten hertz can be used for more evenly depositing the magnetically orientable material without producing substantial eddy currents in the electromagnet core. As an additional control over the deposition process, the relative duration of the positive and negative portions of the alternating current cycle can be varied.

Although the invention has been described with distinct examples of electromagnets, different features of the examples can be combined with each other. For example, the side steps 90, 92, 94, and 96 of the electromagnet 70 could be formed in sides of the electromagnet 44 to achieve similar results. The electromagnet 44 could also be made with two magnetic core plates separated by nonmagnetic cooling conduits. In addition, both magnets 44 and 70 could be powered by the alternating current power supply of electromagnet 34.

Figure 6:
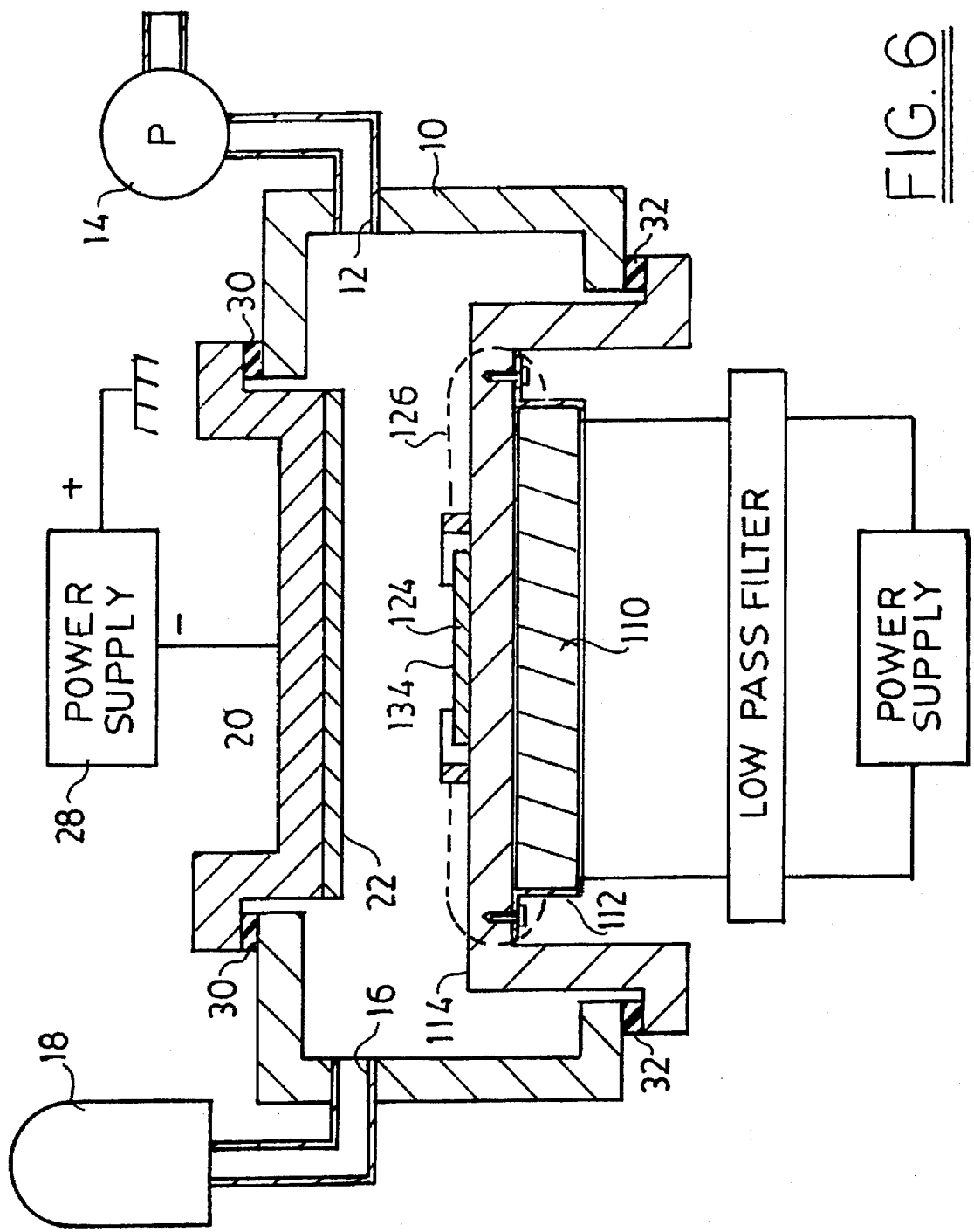
FIG. 6 is a schematic side view of the sputtering apparatus of FIG. 1 with field shapers mounted on an alternative substrate holder and electromagnet assembly.
Figure 7:
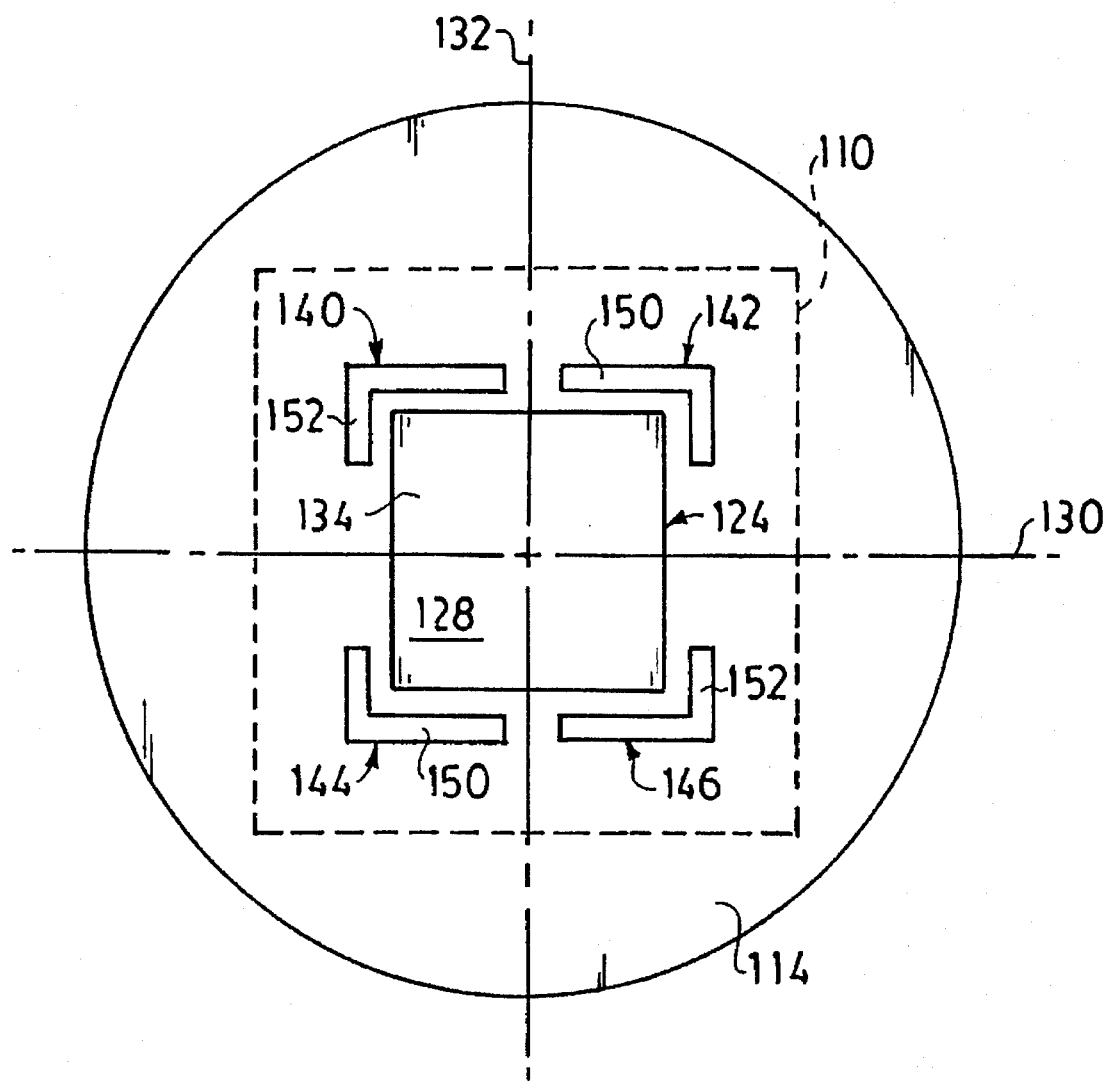
FIG. 7 is a top view of the alternative substrate holder showing the orientation of the field shapers with respect to the substrate and electromagnet.
Figure 8:
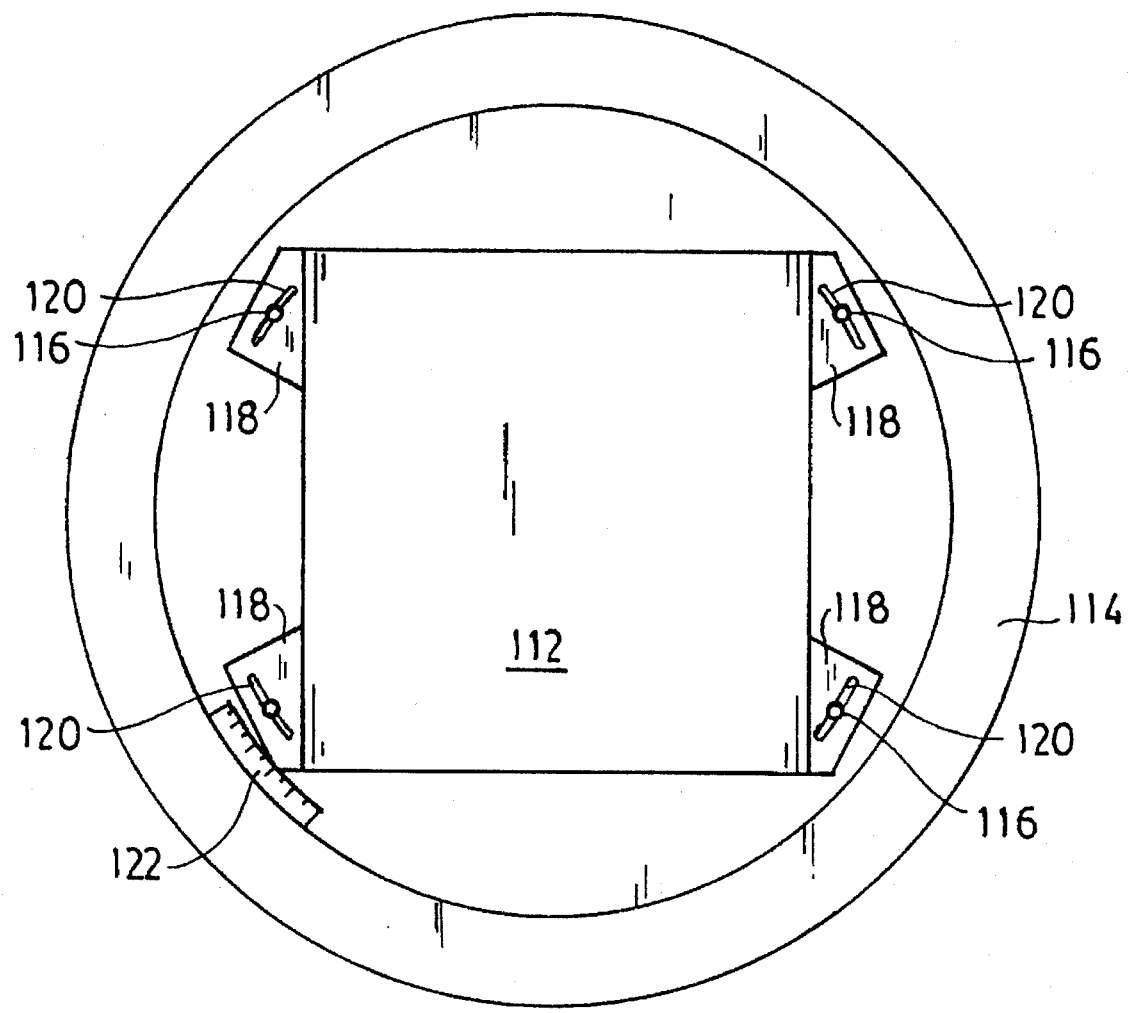
FIG. 8 is a bottom view of the alternative substrate holder showing an angularly adjustable mount for the electromagnet.

FIGS. 6–8 illustrate an alternative embodiment including another way of enlarging the effective area of the magnetic field and a way of changing the orientation of the magnetic field with respect to the substrate. A similar electromagnet 110 is carried in a nonmagnetic tray 112 that is pivotally attached to a bottom of a substrate holder 114 by screws 116. The tray 112 has flanges 118 with arcuate slots 120 that permit angular movement of the tray 112 with respect to the screws 116 through approximately 10 degrees. A vernier 122 provides a measure of the angular orientation of the electromagnet 110 with respect to a substrate 124.

Similar to the preceding embodiments, the electromagnet 110, which is located outside of the vacuum chamber 10, produces a magnetic field 126 inside the vacuum chamber 10 having special characteristics within a given area of a plane 128 that is coincident with a surface of the substrate 124 on which a film 134 of magnetically orientable material is deposited. The magnetic field 126 within the given area of the plane 128 is defined by a locus of field strength vectors that vary in absolute magnitude between points located along a first of two orthogonal axes 130 and 132 but have substantially uniform components of magnitude at the same points measured in a common direction along the first axis 130. The field strength vectors have substantially zero components of magnitude measured at the same points along the second axis 132. The relative angular position of the two orthogonal axes 130 and 132 with respect to the substrate 124 is measured by the vernier 122.

Mounted on the substrate holder 114 adjacent to the substrate 124 within the vacuum chamber 10 are four field shapers 140, 142, 144, and 146 made of a magnetically permeable material such as cold rolled steel. The field shapers 140, 142, 144, and 146 are shaped and positioned for enlarging the given area of magnetic field 126 that is effective for orienting magnetic domains of the deposited film 134 on the substrate 124. As a result, larger areas of magnetic material can be oriented with a given size electromagnet.

Each of the field shapers 140, 142, 144, and 146 is L-shaped including long and short orthogonal arms 150 and 152. The long orthogonal arms 150 are oriented parallel to orthogonal axis 130, which corresponds to the so-called "easy" axis of the deposited film 134. The short orthogonal arms 152 are oriented parallel to orthogonal axis 132, which corresponds to the so-called "hard" axis of the deposited film 134. The field shapers 140 and 142 are mirror symmetrical with the field shapers 144 and 146 about the first orthogonal axis 130. The field shapers 140 and 144 are mirror symmetrical with the field shapers 142 and 146 about the second orthogonal axis 132.

Figure 9A:
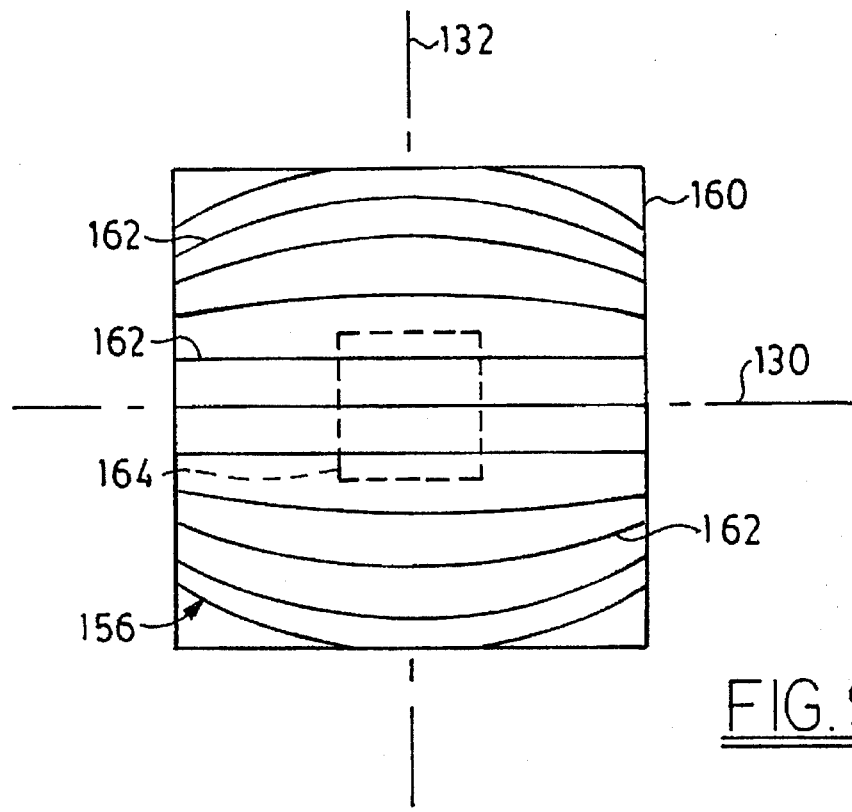
FIGS. 9A and 9B are schematic plan views of two magnetic fields generated by the electromagnet independently and in conjunction with the field shapers.
Figure 9B:
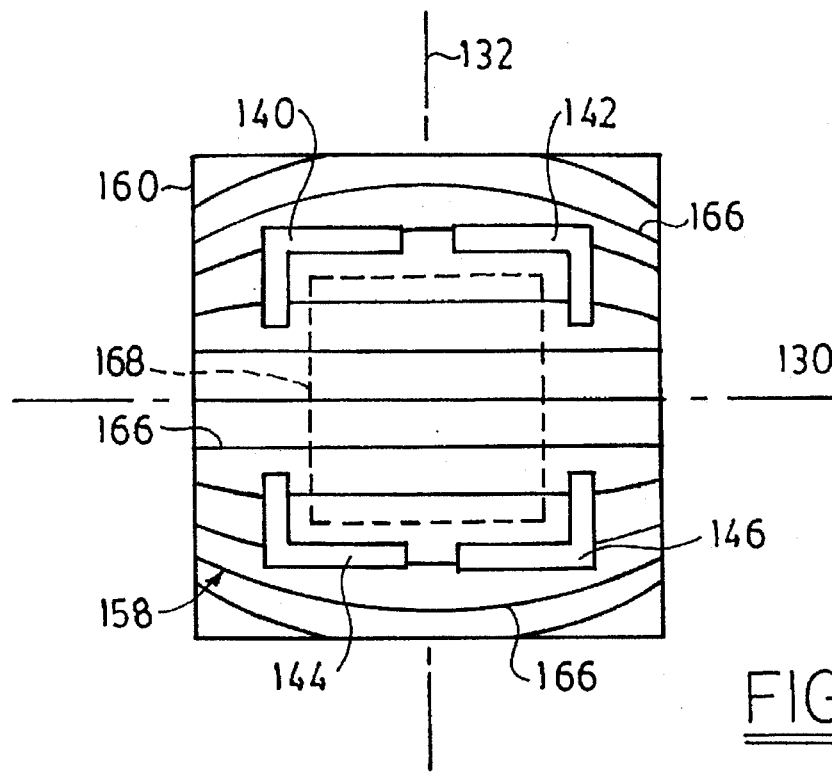

FIGS. 9A and 9B illustrate two different magnetic fields 156 and 158 in the plane 128 produced by the electromagnet 110 independently and in conjunction with the field shapers 140, 142, 144, and 146. Boundary 160 represents the area of the electromagnet 110 projected into the plane 128.

In FIG. 9A, the magnetic field 156 is shown as it might appear without the field shapers 140, 142, 144, and 146. Magnetic lines of force 162 become increasingly curved with distance from the axis 130. Boundary 164 defines a useful area of the magnetic field 156 within which the magnetic field lines 162 are skewed less than a predetermined tolerance, preferably two degrees. However, the useful area 164 represents only a small portion of the area 160 of the electromagnet 110, e.g., less than ten percent. Accordingly, the required electromagnet size can become impractically large for processing some substrates.

FIG. 9B shows the intended magnetic field 158 produced by the electromagnet 110 in conjunction with the field shapers 140, 142, 144, and 146. The field shapers 140, 142, 144, and 146 increase magnetic permeability of particular regions in the plane 128 to better align magnetic lines of force 166 with the axis 130. Boundary 168 defines the much larger useful area of the magnetic field 158 produced by the field shapers 140, 142, 144, and 146. Preferably, the field shapers 140, 142, 144, and 146 are arranged so that the useful area 168 encompasses at least one-third of the electromagnet area 160.

For example, a 9.25 by 9.25 inches plate-shaped electromagnet was found to produce a useful area measuring only 2.0 by 2.0 inches. However, after adding four L-shaped field shapers, the useful area increased to 6.0 by 6.0 inches. The four field shapers were made out of cold rolled steel to 0.125 inches thickness with a width of 0.25 inches. The two arms measured 1.5 inches and 4.0 inches, respectively. When assembled, the field shapers formed the corners of a rectangle measuring 7.5 inches by 8.5 inches and were spaced from the electromagnet by 0.375 inches. The surface of the substrate was positioned midway of the field shaper thickness. Different size electromagnets could be similarly scaled.

We claim:

1. A method of magnetically orienting a film on a substrate comprising the steps of:

mounting the substrate on a substrate holder within a vacuum chamber;

mounting a target of magnetically orientable material adjacent to the substrate within the vacuum chamber;

depositing a thin film of the magnetically orientable material on a surface of the substrate;

locating a plate-shaped electromagnet adjacent to the substrate holder and in alignment with the target and the substrate holder, remote outside of from the target, and outside of the vacuum chamber;

orienting a plate-shaped core of the electromagnet parallel to the surface of the substrate;

sizing a surface of the plate-shaped core larger in area than the substrate surface;

using the plate-shaped electromagnet to apply a magnetic field that produces an average alignment between magnetic domains of the deposited film within one degree of uniaxial anisotropy; and powering the electromagnet with an alternating current at a cycle rate less than one hertz for more evenly depositing the magnetically orientable material without producing substantial eddy currents in the electromagnet.

2. The method of claim 1 in which the magnetic field is applied within a given area of a plane having first and second orthogonal axes and defined by a locus of field strength vectors that vary in absolute magnitude between points located along the first axis but have substantially uniform components of magnitude at the same points measured in a common direction along the first axis.

3. The method of claim 2 in which the uniform components of magnitude are within 5 percent throughout the given area of the plane.

4. The method of claim 3 in which the magnetic field has a strength between 30 gauss and 100 gauss on the surface of the substrate.

5. The method of claim 2 including the further steps of:

forming field shapers of magnetically permeable material with two orthogonal arms;

locating the field shapers adjacent to the substrate within the vacuum chamber for enlarging the given area of the magnetic field plane; and separating the field shapers from the electromagnet by the substrate holder.

6. The method of claim 5 in which a first of the orthogonal arms is oriented parallel to the first axis of the magnetic plane and a second of the orthogonal arms is oriented parallel to the second axis of the magnetic plane.

7. The method of claim 6 in which the first orthogonal arm is longer than the second orthogonal arm.

8. The method of claim 7 in which the field shapers are L-shaped.

9. The method of claim 1 in which the magnetic field is applied completely externally of the vacuum chamber.

10. The method of claim 1 including the further step of angularly adjusting the electromagnet with respect to the substrate holder for changing the orientation of the first and second orthogonal axes of the magnetic plane with respect to the substrate.

11. The method of claim 1 in which the alternating current cycles between positive and negative directions and the positive and negative portions of the cycle have unequal duration for controlling the distribution of magnetically orientable material on the substrate surface.

* * * * *

UNITED STATES PATENT AND TRADEMARK OFFICE
CERTIFICATE OF CORRECTION

PATENT NO. : 5,630,916
DATED : May 20, 1997
INVENTOR(S) : Kevin S. Gerrish, et al It is certified that error appears in the above-identified patent and that said Letters Patent is hereby corrected as shown below:

Col. 7, Line 51, delete "outside of"

Signed and Sealed this

Tenth Day of February, 1998

Attest:

BRUCE LEHMAN

Attesting Officer

Commissioner of Patents and Trademarks